United States Patent
Lee et al.

(10) Patent No.: US 7,189,641 B2
(45) Date of Patent: Mar. 13, 2007

(54) METHODS OF FABRICATING TUNGSTEN CONTACTS WITH TUNGSTEN NITRIDE BARRIER LAYERS IN SEMICONDUCTOR DEVICES, TUNGSTEN CONTACTS WITH TUNGSTEN NITRIDE BARRIER LAYERS

(75) Inventors: Sang-Woo Lee, Seoul (KR); Gil-Heyun Choi, Gyeonggi-do (KR); Jong-Myeong Lee, Gyeonggi-do (KR); Kyung-In Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 10/920,482

(22) Filed: Aug. 18, 2004

(65) Prior Publication Data

US 2005/0266684 A1 Dec. 1, 2005

(30) Foreign Application Priority Data

Aug. 19, 2003 (KR) .......................... 10-2003-57264

(51) Int. Cl.
*H01L 21/4763* (2006.01)
(52) U.S. Cl. ...................... 438/637; 438/644; 438/647; 438/675; 257/E21.585
(58) Field of Classification Search ...................... None
See application file for complete search history.

(56) References Cited

U.S. PATENT DOCUMENTS

| | | | |
|---|---|---|---|
| 6,207,558 B1 * | 3/2001 | Singhvi et al. | 438/648 |
| 6,255,187 B1 * | 7/2001 | Horii | 438/396 |
| 6,284,646 B1 * | 9/2001 | Leem | 438/629 |
| 6,429,493 B1 * | 8/2002 | Asahina et al. | 257/382 |
| 6,524,952 B1 * | 2/2003 | Srinivas et al. | 438/649 |
| 2003/0129828 A1 * | 7/2003 | Cohen | 438/629 |
| 2003/0143328 A1 * | 7/2003 | Chen et al. | 427/255.28 |

FOREIGN PATENT DOCUMENTS

| | | |
|---|---|---|
| JP | 2000-040673 | 2/2000 |
| KR | 1019990059074 | 7/1999 |
| KR | 100274603 | 9/2000 |
| KR | 000061705 A | 10/2000 |
| KR | 1020000061705 | 10/2000 |
| KR | 1020020032168 | 5/2002 |
| KR | 1020030023286 A | 3/2003 |
| KR | 1020030023286 | 3/2005 |

OTHER PUBLICATIONS

Notice to File a Response/Amendment to the Examination Report for Korean patent application 10-2003-0057264 mailed on Jul. 11, 2005.

* cited by examiner

*Primary Examiner*—Michael Lebentritt
*Assistant Examiner*—Cheung Lee
(74) *Attorney, Agent, or Firm*—Myers Bigel Sibley & Sajovec, PA

(57) ABSTRACT

A method forming a tungsten contact can include forming a contact hole in an interlayer dielectric layer to expose a portion of an underlying silicon based substrate and to form a side wall of the contact hole. A tungsten silicide layer can be formed on at least on the exposed portion of the substrate. A tungsten nitride layer can be conformally formed on a surface of the interlayer dielectric layer, on the tungsten silicide layer and on the side wall. A contact tungsten layer can be formed on the tungsten nitride layer to fill the contact hole. Related apparatus and contacts are also disclosed.

17 Claims, 6 Drawing Sheets ns of fabricating tungsten contacts with tungsten nitride barrier layers in semiconductor devices, tungsten contacts with tungsten nitride barrier layers

METHODS OF FABRICATING TUNGSTEN CONTACTS WITH TUNGSTEN NITRIDE BARRIER LAYERS IN SEMICONDUCTOR DEVICES, TUNGSTEN CONTACTS WITH TUNGSTEN NITRIDE BARRIER LAYERS

CROSS-REFERENCE TO RELATED APPLICATION

This application claims the benefit of Korean Patent Application No. 2003-57264, filed Aug. 19, 2003, the disclosure of which is hereby incorporated herein by reference in its entirety.

FIELD OF THE INVENTION

The present invention relates to methods of fabricating semiconductor devices, contacts so formed and apparatus for fabricating the same.

BACKGROUND

As semiconductor devices become highly integrated, a size of a contact hole becomes small but an aspect ratio thereof becomes increased. Tungsten can be used to fill such contact holes, because the tungsten has a good step coverage. Additionally, a melting temperature of the tungsten can be as high as (or more) than 3400° C. and the tungsten has large resistances with respect to electromigration and heat.

Conventionally, a titanium layer is stacked and thermally treated to form a titanium silicide layer as an ohmic layer before filling a contact hole with tungsten (that exposes a semiconductor substrate through an interlayer dielectric layer), in order to overcome an electrical resistance difference between the semiconductor substrate and tungsten. When the tungsten is formed on the titanium silicide layer by a chemical vapor deposition (CVD) method, WF6, which is one of the source gases, may damage the titanium silicide layer. Additionally, the tungsten may have poor adhesion force with a silicon oxide that forms the interlayer dielectric layer. Thus, in order to improve the adhesion force and prevent damage of the titanium silicide layer, a barrier layer such as titanium nitride is formed before depositing the tungsten layer.

However, a titanium-containing layer such as titanium nitride has poor resistance to high temperatures (about 600° C.). If a temperature of more than 600° C. is applied in a subsequent process, the tungsten and the semiconductor substrate may react with each other to increase contact resistance. Titanium is usually formed by a chemical vapor deposition (CVD) method using $TiCl_4$ as a source gas but this method may require temperatures of more than 650° C., which may affect a dielectric layer of a capacitor. Additionally, an electrical resistance may be increased or a short may occur due to electromigration of a metal. This electromigration may occur at an interface between different metal materials. Thus, various problems (due to electromigration) may occur between the tungsten layer and the titanium nitride layer. These problems may degrade reliability of a semiconductor device.

Additionally, when a contact plug is formed of tungsten, since source gases and process conditions for forming the tungsten are different from those for forming the titanium silicide and the titanium nitride, the process may be complicated where only one piece of processing equipment is to be used. Thus, the process may be carried out using several different types of equipment, which may complicate the process.

SUMMARY

Embodiments according to the invention can provide methods of fabricating tungsten contacts with tungsten nitride barrier layers in semiconductor devices, tungsten contacts with tungsten nitride barrier layers, and apparatus for fabricating the same. In some embodiments according to the invention, a method forming a tungsten contact can include forming a contact hole in an interlayer dielectric layer to expose a portion of an underlying silicon based substrate and to form a side wall of the contact hole. A tungsten silicide layer can be formed on at least the exposed portion of the substrate. A tungsten nitride layer can be conformally formed on a surface of the interlayer dielectric layer, on the tungsten silicide layer and on the side wall. A contact tungsten layer can be formed on the tungsten nitride layer to fill the contact hole.

In some embodiments according to the invention, a tungsten adhesive layer can be formed on the side wall between the interlayer dielectric layer and the tungsten nitride layer. The tungsten silicide layer can be formed on the side wall and a tungsten adhesive layer can be formed on the side wall between the tungsten silicide layer and the tungsten nitride layer. In some embodiments according to the invention, forming the tungsten silicide layer can further include forming a tungsten layer on the exposed portion and on the sidewall. The tungsten layer on the exposed portion can be reacted with the silicon in the underlying substrate to form the tungsten silicide layer from a portion of the tungsten layer on the exposed portion so that a remaining portion of the tungsten layer on the exposed portion remains un-reacted with the silicon. In some embodiments according to the invention, forming a tungsten silicide layer can include forming the tungsten silicide layer using atomic layer deposition.

In some embodiments according to the invention, forming the tungsten silicide layer using atomic layer deposition can further include supplying borane ($B_2H_6$) gas to deposit boron on the substrate. Tungsten fluoride ($WF_6$) gas can be supplied to replace the boron with tungsten. Silane gas ($SiH_4$) can be supplied to the substrate to form the tungsten silicide layer.

In some embodiments according to the invention, a method of forming a tungsten contact can include forming a contact hole having a side wall through an interlayer dielectric layer to expose a metal silicide layer on a semiconductor substrate. A tungsten nitride layer can be conformaly formed on an entire surface of the semiconductor substrate including in the contact hole on the side wall. A contact tungsten layer can be formed on the tungsten nitride layer to fill the contact hole.

In some embodiments according to the invention, before forming the tungsten nitride layer, an adhesive tungsten layer can be conformally formed on an entire surface of the semiconductor substrate having the tungsten silicide layer covering at least the exposed metal silicide layer at a bottom of the contact hole. In some embodiments according to the invention, the adhesive tungsten layer is formed using atomic layer deposition.

In some embodiments according to the invention, the atomic layer deposition can include repeatedly supplying borane ($B_2H_6$) gas and supplying tungsten fluoride ($WF_6$) gas to the substrate. In some embodiments according to the invention, the tungsten nitride layer is formed using atomic layer deposition. In some embodiments according to the invention, the atomic layer deposition includes repeatedly supplying borane ($B_2H_6$) gas, supplying tungsten fluoride ($WF_6$) gas, and supplying ammonia ($NH_3$) gas to the substrate.

In some embodiments according to the invention, an apparatus for forming a tungsten contact can include a load lock chamber configured to contain a wafer having a contact hole formed therein. A transfer chamber can be connected to the load lock chamber and a robot arm can be included therein configured to transfer the wafer between different chambers connected to the transfer chamber. A pre-cleaning chamber can be connected to the transfer chamber and configured to contain the wafer during cleaning. A first process chamber can be connected to the transfer chamber and configured for use in forming a tungsten silicide layer on the wafer. A second process chamber can be connected to the transfer chamber and configured for use in forming a tungsten nitride layer on the wafer. A third process chamber can be connected to the transfer chamber and configured for use in forming a contact tungsten layer on the wafer.

In some embodiments according to the invention, the first process chamber can be an atomic layer deposition (ALD) chamber. In some embodiments according to the invention, the first process chamber can be a supply means to supply a tungsten fluoride ($WF_6$) gas, and a supply means to supply a silane ($SiH_4$) gas.

In some embodiments according to the invention, the first process chamber can be a supply means to supply borane ($B_2H_6$) gas. In some embodiments according to the invention, a fourth process chamber can be connected to the transfer chamber and configured for use in conformally forming a tungsten layer on the wafer. In some embodiments according to the invention, the fourth process chamber can be an atomic layer deposition chamber. In some embodiments according to the invention, the fourth process chamber can include a supply means to supply a borane ($B_2H_6$) gas and a supply means to supply a tungsten fluoride ($WF_6$) gas. In some embodiments according to the invention, the second process chamber can be an atomic layer deposition chamber.

In some embodiments according to the invention, a contact in a semiconductor device can include a tungsten silicide layer on an exposed portion of a substrate in a contact hole having a side wall in an interlayer dielectric layer included in the semiconductor device. A tungsten layer can be on the side wall. A tungsten nitride layer can be on the tungsten layer and a tungsten contact can be on the tungsten nitride layer in the contact hole.

In some embodiments according to the invention, the second process chamber can include a supply means to supply a borane ($B_2H_6$) gas, a supply means to supply a tungsten fluoride ($WF_6$) gas, and a supply means to supply an ammonia ($NH_3$) gas. In some embodiments according to the invention, the third process chamber can be a chemical vapor deposition (CVD) chamber. In some embodiments according to the invention, the pre-cleaning chamber can be a dry cleaning chamber configured for use of a fluoride gas and/or an inert gas.

DETAILED DESCRIPTION OF EMBODIMENTS ACCORDING TO THE INVENTION

Figure 1:
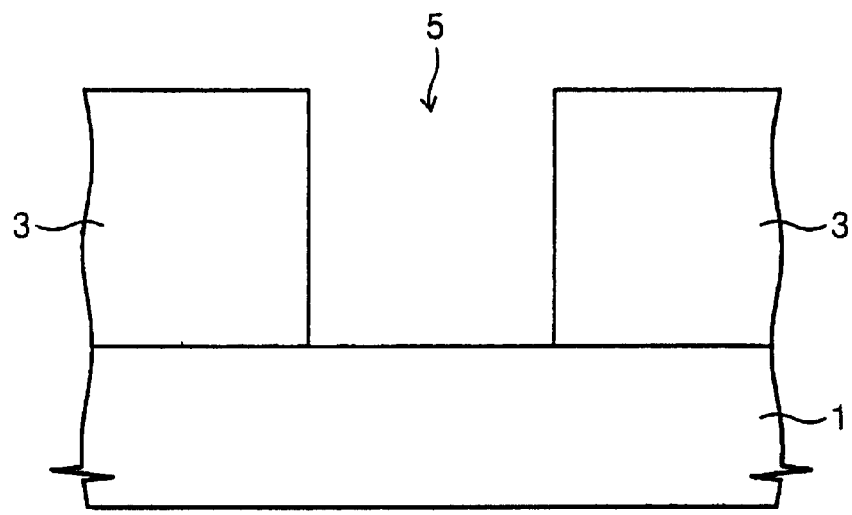
FIGS. 1, 2 and 3A are cross-sectional views sequentially showing methods of forming tungsten contacts of a semiconductor device according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a layer illustrated as having a smooth surface will, typically, have some roughness rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 2:
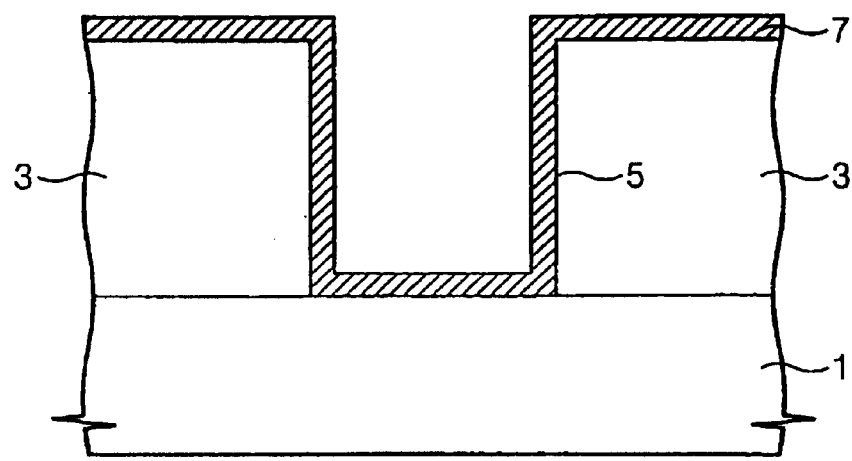
Figure 3A:
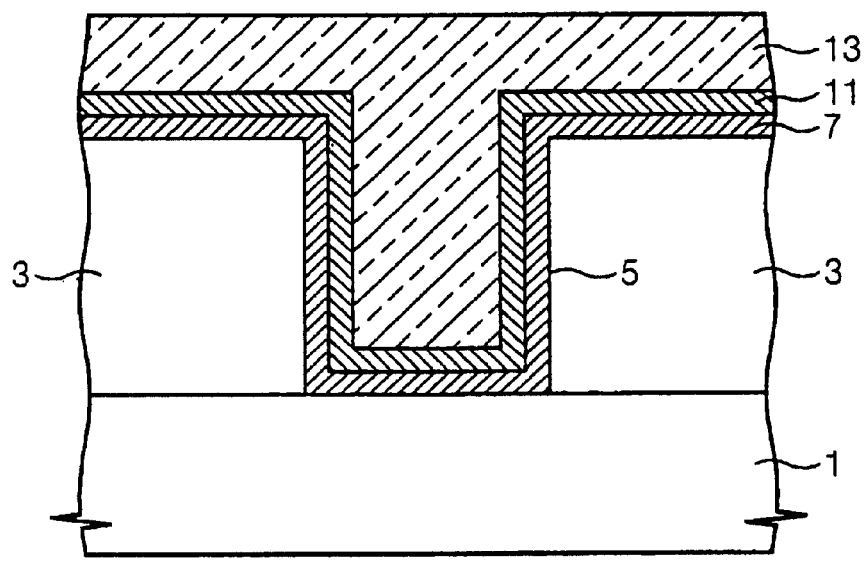

FIGS. 1, 2 and 3A are cross-sectional views sequentially showing methods of forming tungsten contacts of a semiconductor device according to some embodiments of the present invention. Referring to FIG. 1, a field oxide layer (not shown) is formed on a semiconductor substrate 1 to define an active region (not shown). Impurity ions of N+ type or P+ type are implanted into the active region of the semiconductor substrate 1 to form impurity-doped regions (not shown).

An interlayer dielectric layer 3 is formed on an entire surface of the semiconductor substrate 1 having the impurity-doped regions. The interlayer dielectric layer 3 may be formed of HSQ(Hydrogen Silsesquioxane), BPSG(Boron Phosphorus Silicate Glass), HDP(High density plasma) oxide, PETEOS(plasma enhanced tetraethyl orthosilicate), USG(Undoped Silicate Glass), PSG(Phosphorus Silicate Glass), PE-$SiH_4$ and/or $Al_2O_3$ by using PECVD(Plasma-enhanced chemical vapor deposition), LPCVD(Low-pressure chemical vapor deposition), ALD(Atomic layer deposition), or SOG(Spin on glass). The interlayer dielectric layer 3 is patterned to form a contact hole 5 that exposes the impurity-doped regions at the semiconductor substrate 1.

Referring to FIG. 2, a tungsten silicide layer 7 is conformally stacked on an entire surface of the semiconductor substrate 1 having the contact hole 5. In some embodiments according to the invention, the tungsten silicide layer 7 is formed by using an atomic layer deposition (ALD). The ALD method may be carried out by the following steps. First, borane ($B_2H_6$) gas is supplied to deposit one layer of boron atoms at a surface of the semiconductor substrate 1 and the interlayer dielectric layer 3. An inert gas such as argon (Ar) is supplied to purge out un-reacted gas or by-produced gas. Then, tungsten fluoride ($WF_6$) gas is supplied to substitute the deposited boron atoms to tungsten atoms. Argon is supplied to purge un-reacted gas or by-produced gas. Silane ($SiH_4$) is supplied to react the tungsten atoms with silicon atoms to form a layer of a tungsten silicide layer with a thickness of atom size. Argon is supplied to purge un-reacted gas or by-produced gas. These steps may be repeatedly carried out to form a tungsten silicide layer 7 having a desirable thickness. In some embodiments according to the invention, each of the gases may have a flow rate of, for example, 400~600 sccm. In some embodiments according to the invention, these steps may be carried out at a pressure of 1 mTorr~100 Torr and at a temperature of 300~700° C.

In other embodiments according to the invention, the ALD is carried out by the following steps. First, silane ($SiH_4$) gas is supplied to deposit silicon atoms to a surface of the semiconductor substrate 1. Argon gas is supplied to purge remaining gases. Tungsten fluoride ($WF_6$) is supplied to form a tungsten silicide layer 7 by reacting the deposited silicon atoms and tungsten atoms. Argon is supplied to purge remaining gases. These may be repeatedly performed to form the tungsten silicide layer 7 having the desired thickness. In some embodiments according to the invention, each of the gases may have flow rate of, for example, 400~600 sccm. In some embodiments according to the invention, these steps may be carried out at a pressure of 1 mTorr~100 Torr and at a temperature of 300~700° C. The tungsten silicide layer 7 is formed to cover at least the semiconductor substrate 1 exposed by the contact hole 5.

Referring to FIG. 3A, a tungsten nitride layer 11 is deposited on the tungsten silicide layer 7. The tungsten nitride layer 11 may be formed by an ALD method. The ALD method of forming the tungsten nitride layer 11 may be carried out by the following steps. First, borane is supplied to deposit boron atoms at a surface of the tungsten silicide layer 7. Argon is supplied to purge the system and tungsten fluoride is supplied to substitute the deposited boron atoms with tungsten atoms. Argon is supplied to purge the system, and then, ammonia is supplied to react the tungsten atoms with nitrogen atoms, thereby forming a tungsten nitride layer 11. Subsequently, argon gas is supplied to purge remaining gases. These steps can be repeatedly carried out to form a tungsten nitride layer 11 having a desirable thickness. In some embodiments according to the invention, each of the gases may have a flow rate of, for example, 400~600 sccm. In some embodiments according to the invention, these steps may be carried out at a pressure of 1 mTorr~100 Torr and at a temperature less than 600° C.

A contact tungsten layer 13 is deposited on the tungsten nitride layer 11 to fill the contact hole 5. The contact tungsten layer 13 may be formed by a chemical vapor deposition (CVD) method. If the contact tungsten layer 13 is formed of tungsten, the CVD method may be carried out at a temperature of 300~400° C. by using tungsten fluoride and silane as source gases. Subsequently, the contact tungsten layer 13, the tungsten nitride layer 11 and the tungsten silicide layer 7 are patterned or planarized to form a tungsten contact.

Figure 3B:
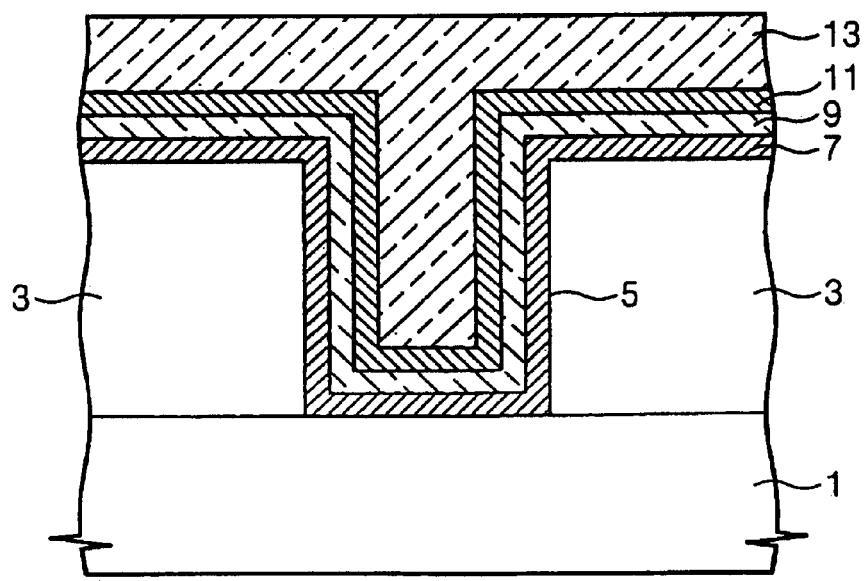
FIG. 3B is a cross-sectional view showing methods of forming tungsten contacts of a semiconductor device according to some embodiments of the present invention.

FIG. 3B is a cross-sectional view showing methods of forming tungsten contacts of a semiconductor device according to some embodiments of the present invention. Referring to FIG. 3b, in the state of FIG. 2, before forming a tungsten nitride layer 11 of FIG. 3A, an adhesive tungsten layer 9 is formed. The adhesive tungsten layer 9 is interposed between the tungsten silicide layer 7 and the tungsten nitride layer 11 and may improve adhesion force therebetween.

The adhesive tungsten layer 9 may be formed by an ALD method. The ALD method of forming the adhesive tungsten layer 9 may be carried out by the following steps. First, borane is supplied to deposit boron atoms on the tungsten silicide layer 7. Remaining gases are purged using argon, and then tungsten fluoride gas is supplied to substitute the boron atoms to tungsten atoms, thereby forming an adhesive tungsten layer 9. Argon is supplied to purge the system. These steps can be repeatedly carried out to form an adhesive tungsten layer 9 having a desired thickness. In some embodiments according to the invention, each of the gases may have flow rate of, for example, 400~600 sccm. In some embodiments according to the invention, these steps may be carried out at a pressure of 1 mTorr~100 Torr and at a temperature less than 300~700° C. A tungsten nitride layer 11 and a contact tungsten layer 13 can be formed as described above in reference to FIGS. 1, 2, and 3A.

Figure 4:
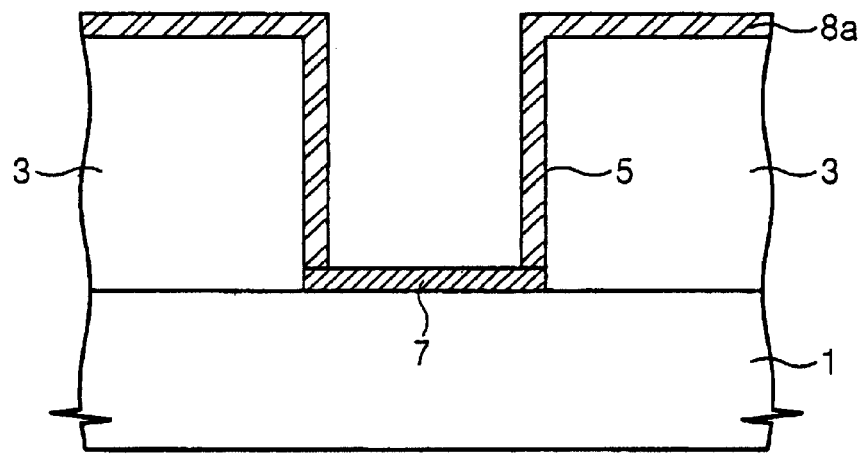
FIGS. 4 and 5A are cross-sectional views sequentially showing methods of forming a tungsten contact of a semiconductor device according to some embodiments of the present invention.
Figure 5A:
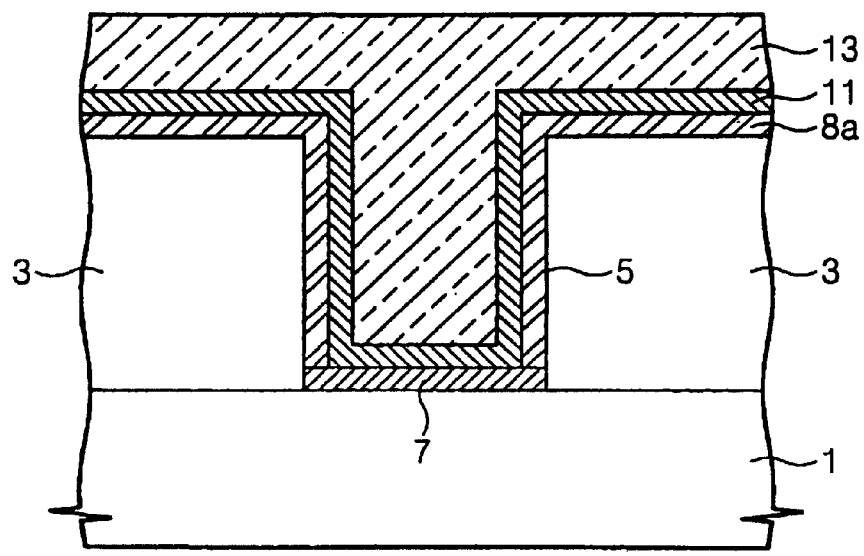

FIGS. 4 and 5A are cross-sectional views sequentially showing methods of forming tungsten contacts of a semiconductor device according to some embodiments of the present invention. Referring to FIG. 4, starting with the structure shown in FIG. 1, a tungsten layer 8a is conformally formed with a first thickness. The tungsten layer 8a may be formed by the same method of forming the adhesive tungsten layer 9. That is, the tungsten layer 8a can be formed by ALD and carried out by the following steps. First, borane is supplied to deposit boron atoms on the tungsten silicide layer 7. Remaining gases are purged using argon, and then tungsten fluoride gas is supplied to substitute the boron atoms with tungsten atoms, thereby forming an adhesive tungsten layer 9. Argon is used to purge the system. These steps can be repeatedly carried out to form an adhesive tungsten layer 9 having a desired thickness. In some embodiments according to the invention, each of the gases may have flow rate of, for example, 400~600 sccm. In some embodiments according to the invention, these steps may be carried out at a pressure of 1 mTorr~100 Torr and at a temperature less than 300~700° C.

When the tungsten layer 8a is deposited by the ALD method, simultaneously, the tungsten layer 8a reacts with the semiconductor substrate 1 at the bottom of the contact hole 5 to form a tungsten silicide layer 7. A thermal treatment process may be additionally performed on the tungsten layer 8a, so that all of the tungsten layer 8a contacting the semiconductor substrate 1 at the bottom of the contact hole 5 reacts to form a tungsten silicide layer 7. In some embodiments according to the invention, the thermal treatment process is performed at a temperature in a range from about 400° C. to about 700° C.

Referring to FIG. 5A, a tungsten nitride layer 11 is conformally entirely stacked. The tungsten nitride layer 11 may be formed using ALD as described above in reference to FIGS. 1, 2, and 3A. A contact tungsten layer 13 is stacked on the tungsten nitride layer 11 to fill the contact hole 5. The contact tungsten layer 13 may be formed using CVD as described above in reference to FIGS. 1, 2, and 3A.

Figure 5B:
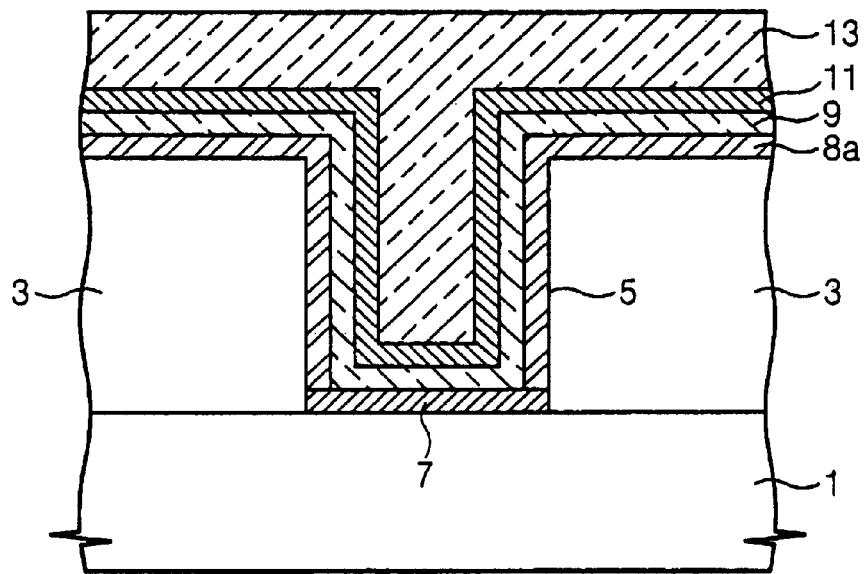
FIG. 5B is a cross-sectional view showing methods of forming tungsten contacts of a semiconductor device according to some embodiments of the present invention.

FIG. 5B is a cross-sectional view showing a method of forming tungsten contacts in a semiconductor device according to some embodiments of the present invention. Referring to FIG. 5B, after forming a tungsten silicide layer 7 in FIG. 5A, before forming a tungsten nitride layer 11, an adhesive tungsten layer 9 is formed to improve adhesion between the tungsten silicide layer 7 and the tungsten nitride layer 11. The adhesive tungsten layer 9 may be formed using ALD as described above in reference to FIG. 3B.

Figure 6:
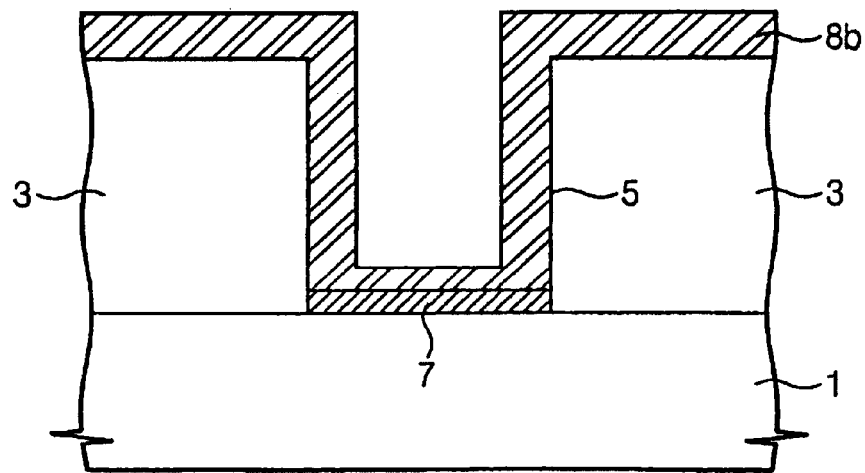
FIGS. 6 and 7 are cross-sectional views sequentially showing methods of forming a tungsten contact of a semiconductor device according to some embodiments of the present invention.
Figure 7:
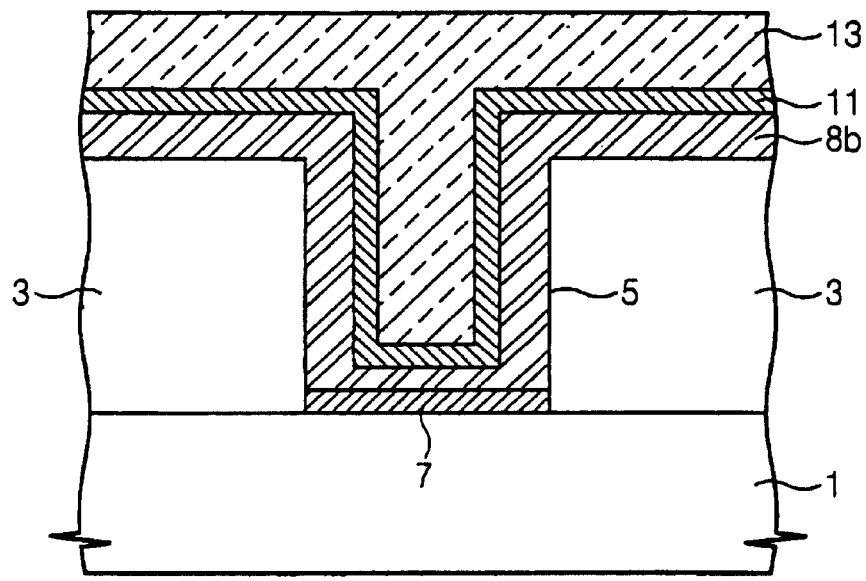

FIGS. 6 and 7 are cross-sectional views sequentially showing methods of forming tungsten contacts in a semiconductor device according to some embodiments of the present invention. Referring to FIG. 6, in the state of FIG. 1, a tungsten layer 8b is entirely conformally formed with a second thickness. The second thickness is thicker than the first thickness of the third embodiment. The tungsten layer 8b may be formed using ALD as described above in reference to forming the tungsten layer 8a as shown in FIGS. 4 and 5A. As described above, when the tungsten layer 8b is deposited by the ALD method, simultaneously, a part of the tungsten layer 8b reacts with the semiconductor substrate 1 at the bottom of the contact hole 5 to form a tungsten silicide layer 7. A thermal treatment process may be additionally performed on the tungsten layer 8b. In some embodiments according to the invention, however, although the thermal treatment process is performed, only a part of the tungsten layer 8b may be changed to the tungsten silicide layer 7 by controlling the process time of the thermal treatment process. Thus, although an adhesive tungsten layer is not additionally deposited, since the entire exposed surface of the tungsten layer 8b is composed of tungsten like the adhesive tungsten layer, a tungsten nitride layer 11 can be deposited subsequently.

Referring to FIG. 7, a tungsten nitride layer 11 and a contact tungsten layer 13 are conformally stacked to fill the contact hole 5. The tungsten nitride layer 11 and the contact tungsten layer 13 may be formed as described above in reference to FIGS. 1, 2, and 3A.

Figure 8A:
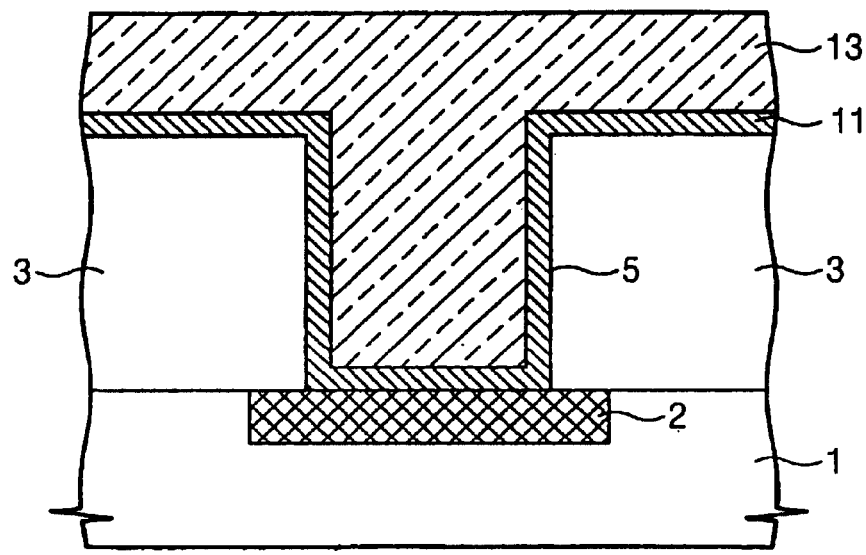
FIG. 8A is a cross-sectional view showing methods of forming tungsten contacts of a semiconductor device according to some embodiments of the present invention.

FIG. 8A is a cross-sectional view showing methods of forming a tungsten contact in a semiconductor device according to some embodiments of the present invention. Referring to FIG. 8A, a metal silicide layer 2 is formed on a semiconductor substrate 1. The metal silicide layer may include titanium, cobalt, nickel, tungsten, aluminum and/or copper. The metal silicide layer 2 may be formed by a general silicidation method. For example, in order to form the metal silicide layer 2, at least one metal layer selected from the group is stacked on an active region between gate patterns (not shown) is stacked and thermally treated. An interlayer dielectric layer 3 is formed on an entire surface of the semiconductor substrate having the metal silicide layer 2. The interlayer dielectric layer 3 is patterned to form a contact hole 5 exposing the metal silicide layer 2. A tungsten nitride layer 11 is conformally formed on an entire surface of the semiconductor substrate having the contact hole 5. A contact tungsten layer 13 is formed on the tungsten nitride layer 11 to fill the contact hole 5. The tungsten nitride layer 11 and the contact tungsten layer 13 may be formed as described above in reference to FIGS. 1, 2, and 3A.

Figure 8B:
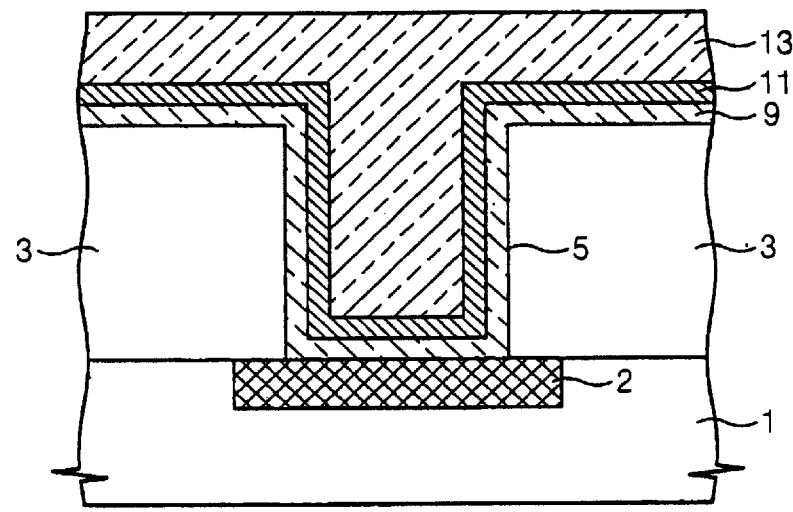
FIG. 8B is a cross-sectional view showing methods of forming tungsten contacts of a semiconductor device according to some embodiments of the present invention.

FIG. 8B is a cross-sectional view showing methods of forming a tungsten contact in a semiconductor device according to some embodiments of the present invention. Referring to FIG. 8B, a metal silicide layer 2 is formed on a semiconductor substrate 1. The metal silicide layer 2 may include titanium, cobalt, nickel, tungsten, aluminum and/or copper. The metal silicide layer 2 may be formed by a general silicidation method. An interlayer dielectric layer 3 is formed on an entire surface of the semiconductor substrate having the metal silicide layer 2. The interlayer dielectric layer 3 is patterned to form a contact hole 5 exposing the metal silicide layer 2. An adhesive tungsten layer 9 and a tungsten nitride layer 11 are sequentially conformally formed on an entire surface of the semiconductor substrate having the contact hole 5. A contact tungsten layer 13 is formed on the tungsten nitride layer 11 to fill the contact hole 5. The adhesive tungsten layer 9, the tungsten nitride layer 11 and the contact tungsten layer 13 may be formed as described above in reference to FIG. 3B.

Figure 9:
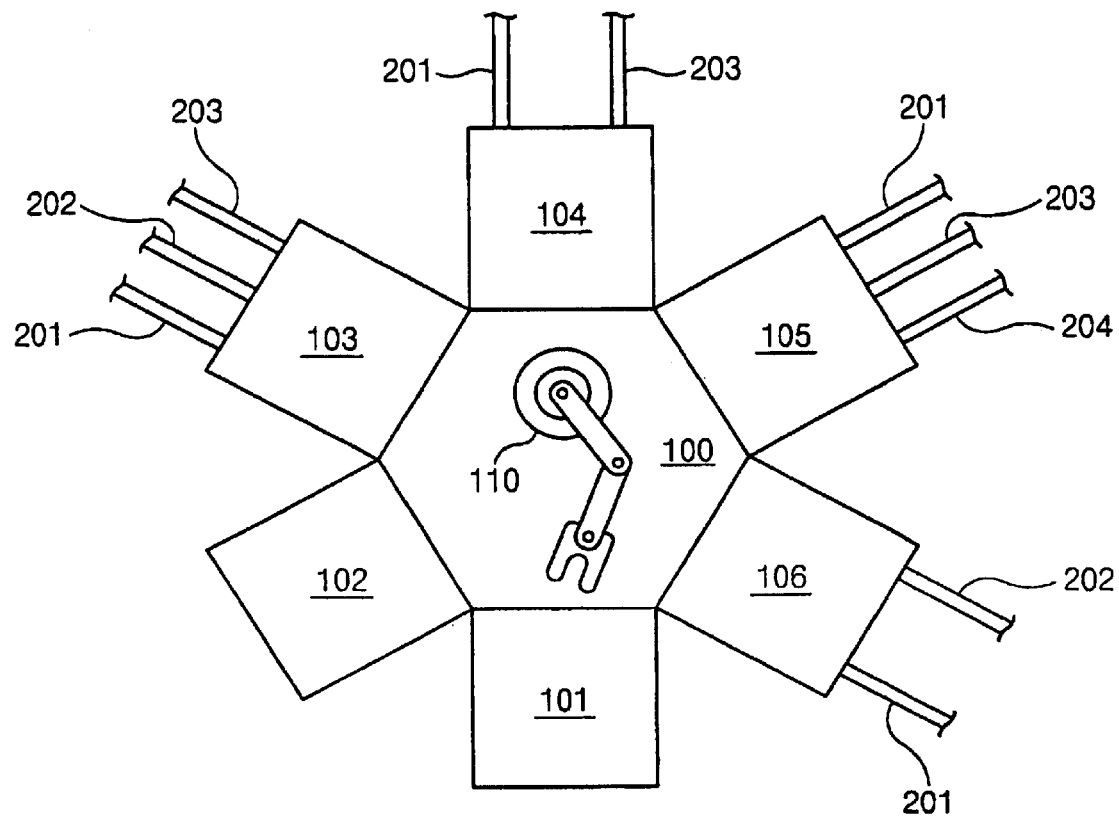
FIG. 9 schematically illustrates an equipment of forming tungsten contacts according to some embodiments of the present invention.

FIG. 9 schematically illustrates an apparatus for forming a tungsten contact according to some embodiments of the present invention. Referring to FIG. 9, tungsten contact-forming equipment according to the present invention is arranged as a cluster system. The cluster system includes a transfer chamber 100 having a robot arm 110 which transfers a wafer between the different chambers shown. A load lock chamber 101 is connected to the transfer chamber 100 and a wafer having a contact hole or a contact plug is loaded into the load lock chamber 101. A pre-cleaning chamber 102 is connected to the transfer chamber 100 and a wafer having a contact hole is cleaned in the pre-cleaning chamber 102. A first process chamber 103 is connected to the transfer chamber 100 and a tungsten silicide layer covering at least a bottom of a contact hole is formed in the first process chamber 103. A fourth process chamber 104 is connected to the transfer chamber 100 and a tungsten layer or an adhesive tungsten layer is formed in the fourth process chamber 104.

A second process chamber 105 is connected to the transfer chamber 100 and is configured so that a tungsten nitride layer is formed in the second process chamber 105. A third process chamber 106 is connected to the transfer chamber 100 and may be positioned between the load lock chamber 101 and the second process chamber 105. A contact tungsten layer is formed in the third process chamber 106. The first, second and fourth process chambers 103, 105 and 104 may be atomic layer deposition devices. The third process chamber 106 may be a chemical vapor deposition device. It will be understood that in other embodiments according to the invention, the positions of the chambers 101, 102, 103, 104, 105 and 106 may be changed.

The first process chamber 103 may include a supply pipe 201 for supplying a tungsten fluoride ($WF_6$) gas and a supply pipe 202 for supplying a silane ($SiH_4$) gas. The first process chamber 103 may further include a supply pipe 203 for supplying a borane ($B_2H_6$) gas. The fourth process chamber 104 may include the supply pipe 203 for supplying the borane ($B_2H_6$) gas and the supply pipe 201 for supplying the tungsten fluoride ($WF_6$) gas. The second process chamber 105 may include the supply pipe 203 for supplying the borane ($B_2H_6$) gas, the supply pipe 201 of supplying the tungsten fluoride ($WF_6$) gas and a supply pipe 204 of supplying an ammonia ($NH_3$) gas. The third process chamber 106 may include the supply pipe 201 of supplying a tungsten fluoride ($WF_6$) gas and the supply pipe 202 of supplying a silane ($SiH_4$) gas.

In the pre-cleaning chamber 102, a dry cleaning process is performed with respect to a wafer having a contact hole exposing a semiconductor substrate through an interlayer dielectric layer by using a fluoride gas such as $NF_3$ or an inert gas such as Ar, thereby removing residues or by-products at a bottom of the contact hole.

In the first process chamber 103, a tungsten silicide layer (7 in FIG. 2) may be formed by an atomic layer deposition as described above in reference to FIGS. 1, 2, and 3A. In the fourth process chamber 104, an adhesive tungsten layer (9 in FIG. 3B) and tungsten layers (8a in FIG. 4, 8b in FIG. 6) may be formed by an atomic layer deposition as described above in reference to FIG. 3B.

In the second process chamber 105, a tungsten nitride layer (11 in FIG. 3A) may be formed by an atomic layer deposition as described above in reference to FIGS. 1, 2, and 3A. In the third process chamber 106, a contact tungsten layer (13 in FIG. 3A) may be formed by a chemical vapor deposition (CVD) as described above in reference to FIG. 1, 2, and 3A.

An example of operations of the apparatus in FIG. 9 is described herein with reference to the structures shown in FIGS. 1, 2, and 3A. Referring to FIGS. 1 and 9, a wafer having a contact hole 5 exposing a semiconductor substrate 1 through an interlayer dielectric layer 3 is loaded into a load lock chamber 101. A robot arm 110 in a transfer chamber 100 transfers the wafer from the load lock chamber 101 to the pre-cleaning chamber 102. In the pre-cleaning chamber 102, residues or by-products in the contact hole 5 are cleaned.

Referring to FIGS. 2 and 9, after cleaning the wafer, the wafer is transferred to a second process chamber 105 by the robot arm 110. In the second process chamber 105, a tungsten nitride layer 11 is formed by the same ALD method as the first embodiment. The wafer having the tungsten nitride layer 11 is transferred to the third process chamber 106 by the robot arm 110. In the third process chamber 106, a contact tungsten layer 13 is formed on the tungsten nitride layer 11 by the same ALD method as the first embodiment. After forming the contact tungsten layer 13, the wafer is loaded into the load lock chamber 101 by the robot arm 110.

As described above, according to the equipment of forming the tungsten contact, source gases and process conditions, required in each process chamber 103, 104, 105 and 106, are similar with each other, so that it is easy to embody one cluster system.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a tungsten contact, comprising:
   forming a contact hole in an interlayer dielectric layer to expose a portion of an underlying silicon based substrate and to form a side wall of the contact hole;
   forming a tungsten silicide layer on at least the exposed portion of the substrate;
   conformally forming an adhesive tungsten layer including only tungsten on an entire surface of the substrate on the tungsten silicide layer on the exposed portion;
   conformally forming a tungsten nitride layer on the adhesive tungsten layer, wherein the adhesive tungsten layer improves adhesion force between the tungsten nitride layer and the tungsten silicide layer; and
   forming a contact tungsten layer on the tungsten nitride layer to fill the contact hole.

2. A method according to claim 1 wherein forming a tungsten silicide layer comprises forming the tungsten silicide layer on the side wall.

3. A method according to claim 1 wherein forming a tungsten silicide layer further comprises:
   forming a tungsten layer on the exposed portion and on the sidewall;
   reacting the tungsten layer on the exposed portion with the silicon in the underlying substrate to form the tungsten suicide layer from a portion of the tungsten layer on the exposed portion so that a remaining portion of the tungsten layer on the exposed portion remains un-reacted with the silicon.

4. A method according to claim 3 wherein forming a tungsten silicide layer comprises thermally treating the tungsten layer.

5. A method according to claim 3 wherein forming a tungsten layer comprises repeatedly supplying borane ($B_2H_6$) gas and supplying tungsten fluoride ($WF_6$) gas to the substrate.

6. A method according to claim 1 wherein forming a tungsten silicide layer comprises forming the tungsten suicide layer using atomic layer deposition.

7. A method according to claim 6 wherein forming the tungsten suicide layer using atomic layer deposition further comprises:
   supplying borane ($B_2H_6$) gas to deposit boron on the substrate;
   supplying tungsten fluoride ($WF_6$) gas to replace the boron with tungsten; and
   supplying silane gas ($SiH_4$) to the substrate to form the tungsten silicide layer.

8. A method according to claim 1 wherein the adhesive tungsten layer is formed using atomic layer deposition.

9. The method of claim 1, wherein forming a tungsten suicide layer comprises forming a tungsten layer at an entire surface of the semiconductor substrate having the contact hole by an atomic layer deposition method, wherein the tungsten suicide layer is formed at an interface between the tungsten layer and the semiconductor substrate exposed by the contact hole when the tungsten layer is formed.

10. The method of claim 9, wherein forming a tungsten silicide layer further comprises thermally treating the tungsten layer.

11. The method of claim 9, wherein the forming a tungsten layer is carried out by repeating steps of supplying borane ($B_2H_6$) gas and supplying tungsten fluoride ($WF_6$) gas.

12. The method of claim 1, wherein forming a tungsten nitride layer comprises:
   supplying borane ($B_2H_6$) gas;
   supplying tungsten fluoride ($WF_6$) gas; and
   supplying ammonia ($NH_3$) gas.

13. A method according to claim 1 wherein forming the adhesive tungsten layer comprises repeatedly performing the following:
   supplying borane gas to deposit boron atoms on the tungsten silicide layer;
   purging the borane gas using Argon; and then
   supplying tungsten fluoride gas to substitute the boron atoms with tungsten atoms; and
   wherein each of the gases is supplied at a flow rate of about 400 to about 600 sccm and at pressure of about 1 mTorr to about 100 Torr and at a temperature less than about 300 to about 700° C.

14. A method of forming a tungsten contact, comprising:
   forming a contact hole having a side wall through an interlayer dielectric layer to expose a metal suicide layer on a semiconductor substrate;
   conformally forming an adhesive tungsten layer including only tungsten on an entire surface of the semiconductor substrate having the metal suicide layer exposed by the contact hole;
   conformally forming a tungsten nitride layer on an entire surface of the semiconductor substrate including the contact hole and the side wall using atomic layer deposition, wherein the adhesive tungsten layer improves adhesion force between the tungsten nitride layer and the tungsten silicide layer; and
   forming a contact tungsten layer on the tungsten nitride layer to fill the contact hole.

15. A method according to claim 14 wherein the adhesive tungsten layer is formed using atomic layer deposition.

16. A method according to claim 14 wherein forming a tungsten nitride layer using the atomic layer deposition comprises repeatedly supplying borane ($B_2H_6$) gas, supplying tungsten fluoride ($WF_6$) gas, and supplying ammonia ($NH_3$) gas to the substrate.

17. A method according to claim 14, wherein forming the adhesive tungsten layer comprises repeatedly performing the following:
   supplying borane gas to deposit boron atoms on the metal silicide layer;
   purging the borane gas using Argon; and then
   supplying tungsten fluoride gas to substitute the boron atoms with tungsten atoms; and
   wherein each of the gases is supplied at a flow rate of about 400 sccm to about 600 sccm and at pressure of about 1 mTorr to about 100 Torr and at a temperature less than about 300° C. to about 700° C.

* * * * *

UNITED STATES PATENT AND TRADEMARK OFFICE
CERTIFICATE OF CORRECTION

PATENT NO. : 7,189,641 B2 Page 1 of 1
APPLICATION NO. : 10/920482
DATED : March 13, 2007
INVENTOR(S) : Lee et al.

It is certified that error appears in the above-identified patent and that said Letters Patent is hereby corrected as shown below:

Column 10,

Line 61, Claim 3: Please correct "suicide layer" to read --silicide layer--

Column 11,

Line 6 -7, Claim 6: Please correct "suicide layer" to read --silicide layer--

Line 9, Claim 7: Please correct "suicide layer" to read --silicide layer--

Line 20, Claim 9: Please correct "suicide layer" to read --silicide layer--

Line 23, Claim 9: Please correct "suicide layer" to read --silicide layer--

Column 12,

Line 9, Claim 14: Please correct "suicide layer" to read --silicide layer--

Line 13, Claim 14: Please correct "suicide layer" to read --silicide layer--

Signed and Sealed this

Fifteenth Day of May, 2007

JON W. DUDAS
*Director of the United States Patent and Trademark Office*